(12) United States Patent
Martines et al.

(10) Patent No.: US 7,254,062 B2
(45) Date of Patent: Aug. 7, 2007

(54) CIRCUIT FOR SELECTING/DESELECTING A BITLINE OF A NON-VOLATILE MEMORY

(75) Inventors: Ignazio Martines, Tremestieri Etneo (IT); Davide Torrisi, Acireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 2 days.

(21) Appl. No.: 11/120,766

(22) Filed: May 3, 2005

(65) Prior Publication Data

US 2005/0249022 A1    Nov. 10, 2005

(30) Foreign Application Priority Data

May 4, 2004    (IT) .......................... VA2004A0020

(51) Int. Cl.
*G11C 11/34* (2006.01)
*G11C 7/02* (2006.01)

(52) U.S. Cl. .............................. 365/185.2; 365/185.21; 365/210

(58) Field of Classification Search ........... 365/185.18, 365/185.2, 185.21, 210
See application file for complete search history.

(56) References Cited

U.S. PATENT DOCUMENTS 5,917,753 A * 6/1999 Dallabora et al. ..... 365/185.21
6,111,791 A * 8/2000 Ghilardelli ............. 365/185.28
6,118,702 A * 9/2000 Shieh et al. ........... 365/185.21
6,157,571 A * 12/2000 Suzuki ..................... 365/185.2
6,449,191 B1 * 9/2002 Lin et al. ................ 365/185.21
7,009,882 B2 * 3/2006 Chen ..................... 365/185.18

* cited by examiner

*Primary Examiner*—Trong Phan
(74) *Attorney, Agent, or Firm*—Lisa K. Jorgenson; Allen, Dyer, Doppelt, Milbrath & Gilchrist, P.A.

(57) ABSTRACT

A bit-line selection circuit for a memory device includes a decoding line and a dummy line: The decoding line is between a regulated voltage node, and a programming voltage node generating a programming voltage for a cell in the memory device. The decoding line includes at least one input transistor connected to the regulated voltage node, and is controlled by an enable/disable signal. The dummy line is identical to the decoding line, and is controlled by the enable/disable signal. An equalization circuit is connected between the decoding and dummy lines for setting a current in the dummy line equal to a current in the decoding line. A regulating circuit regulates the programming voltage generated at the programming voltage node in the decoding line. The regulating circuit has a first input for receiving a reference voltage, a second input for receiving a sensed voltage on the programming voltage node in the dummy line, and an output for providing the enable/disable signal. The regulating circuit compensates for differences between the programming voltage and the reference voltage.

17 Claims, 2 Drawing Sheets

CIRCUIT FOR SELECTING/DESELECTING A BITLINE OF A NON-VOLATILE MEMORY

FIELD OF THE INVENTION

The invention relates in general to semiconductor memory devices, and more particularly, to circuits for selecting bit-lines.

BACKGROUND OF THE INVENTION

In semiconductor memory devices circuits are used for selecting/deselecting addressed memory cells. A example circuit is shown in FIG. 1. The circuit comprises a decoding line that includes a plurality of decoding transistors connected in series and which are controlled by respective selection signals DEC<3>, DEC<2>, DEC<1>. The decoding line also includes at least one transistor controlled by an enable/disable signal PGM, and is connected between a node having a regulated voltage $V_{PD}$ and the series of decoding transistors. When a bit-line is selected, the signals PGM, DEC<3>, DEC<2>, DEC<1> enable the respective transistors. In the memory cells, which are substantially transistors, there are non-null voltages.

An important field of application of the invention is to non-volatile Flash memory devices. For this reason reference will be made to these devices, though other types of semiconductor memory devices are applicable. The programming voltage on the drain of Flash memory cells should be regulated to a precise value. This is very difficult without occupying a large area of silicon.

The voltage on the terminals of any memory cell to be programmed (drain-source voltage) depends on the current flowing in the cell ($I_{P<i>}$), the number of bits to be programmed at the time, the supply voltage of the memory ($V_{CC}$), and the operating temperature (T). By observing the typical example of column decoding used in Flash memory devices depicted in FIG. 1, the following is noted: PGM<15:0> are on/off signals that enable the pass-transistor depending on whether a certain bit is to be programmed or not; $V_{PD}$ is the regulated voltage commonly generated by a charge pump circuit; DEC<3:1> are selection signals of the column decoding; and $BL_{<i>}$ are local bit-lines.

In a partitioned memory device, wherein 16 cells at a time are to be programmed, there are 16 pass transistors controlled by the PGM signals. There are also N*16 transistors driven by the selection signal DEC<3>, 16*N*M transistors controlled by the selection signal DEC<2>, and 16*N*M*L transistors controlled by the selection signal DEC<1>, wherein N, M and L are all multiples of 2.

The problems that arise when a decoding circuit such as that of FIG. 1 is used are as follows. It is very difficult to form a regulator for the voltage BL on each cell to be programmed because 16*N*M*L voltage regulators would be required. This results in an unacceptable area occupied silicon.

The current flowing in each cell, designed for a certain nominal value, has a spread that becomes larger as the fabrication process becomes less precise. The current flowing in a cell determines a voltage drop on the selection transistors of the relative bit-line path, and in particular, on the selection transistor controlled by the signal DEC<1>. The selection transistors controlled by DEC<1> are as numerous as the cells of a row. They should be accommodated in the cell pitch, thus they are very small. The voltage drop along the bit-line path $\Delta V(I_P)$ is approximately given by the drop on the transistors controlled by DEC<1> (low level decoding transistors), as depicted in FIG. 2. The voltage on the nodes of the cell is about $V_{PD}-\Delta V(I_P)$, thus the programming voltage depends on the current absorbed by the single cell.

The functioning temperature is relevant because when it varies, the resistivity of the low level decoding transistors also varies. The regulated voltage $V_{PD}$ generally depends on the total current absorption by all addressed cells. The voltage drop $BL_{<i>}$ on a cell, which depends on the voltage $V_{PD}$, indirectly depends upon the number of bits (addressed cells) to be programmed.

If the supply voltage $V_{CC}$ varies, the performance of the charge pump circuit also varies as well as the regulated voltage $V_{PD}$. As a consequence, the programming voltage $BL_{<i>}$ on each cell varies.

Generally, the following equation holds:

$$BL_{<i>}=V_{PD}[\Sigma I_{P<i>},V_{CC}]-\Delta V_{IP}[T,I_{P<i>}]$$

Keeping the voltage drop $BL_{<i>}$ on the i-th cell within an acceptable range is difficult when the above parameters vary.

These conditions impose a compromise in which the programming voltage may differ from its nominal value. This compromise may be tolerable in some classes of memory devices. However, it becomes impracticable in multi-level memory devices where the drain voltage on the cells needs to be precisely determined.

SUMMARY OF THE INVENTION

In view of the foregoing background, an object of the present invention is to overcome the drawbacks of bit-line selection/deselection circuits.

This and other objects, features and advantages in accordance with the invention are provided by a dummy line that is a replica of a bit-line decoding line, and forcing through it the same current that circulates in the decoding line. The decoding line and the dummy line are substantially identical. Thus, there will be a node of the dummy line at the same programming potential of an addressed cell of the decoding line. By setting the potential of this node of the dummy line to a constant reference value, the programming potential of the decoding line is also effectively fixed.

More precisely, the bit-line selection/deselection circuit for a non-volatile memory may comprise decoding lines connected between a node at a regulated voltage and a node on which a programming voltage for an addressed memory cell is produced. Each circuit includes at least one transistor controlled by an enable/disable signal, and is connected between a node having a regulated voltage and the series of decoding transistors.

The dummy line may be identical to the decoding line and may also be identically controlled. The dummy line is coupled to the same node having the regulated voltage as the decoding line. An equalization circuit forces through the dummy line the same current that is forced in the decoding line. A regulation circuit for the programming voltage comprises a reference voltage with the voltage present on the node of the dummy line corresponding to the node of the decoding line on which the programming voltage is produced. The regulation circuit generates the enable/disable signal to compensate for differences between the programming voltage and the reference voltage.

BRIEF DESCRIPTION OF THE DRAWINGS

The invention is described while referring to the attached drawings, wherein.

DETAILED DESCRIPTION OF THE PREFERRED EMBODIMENTS

Figure 3:
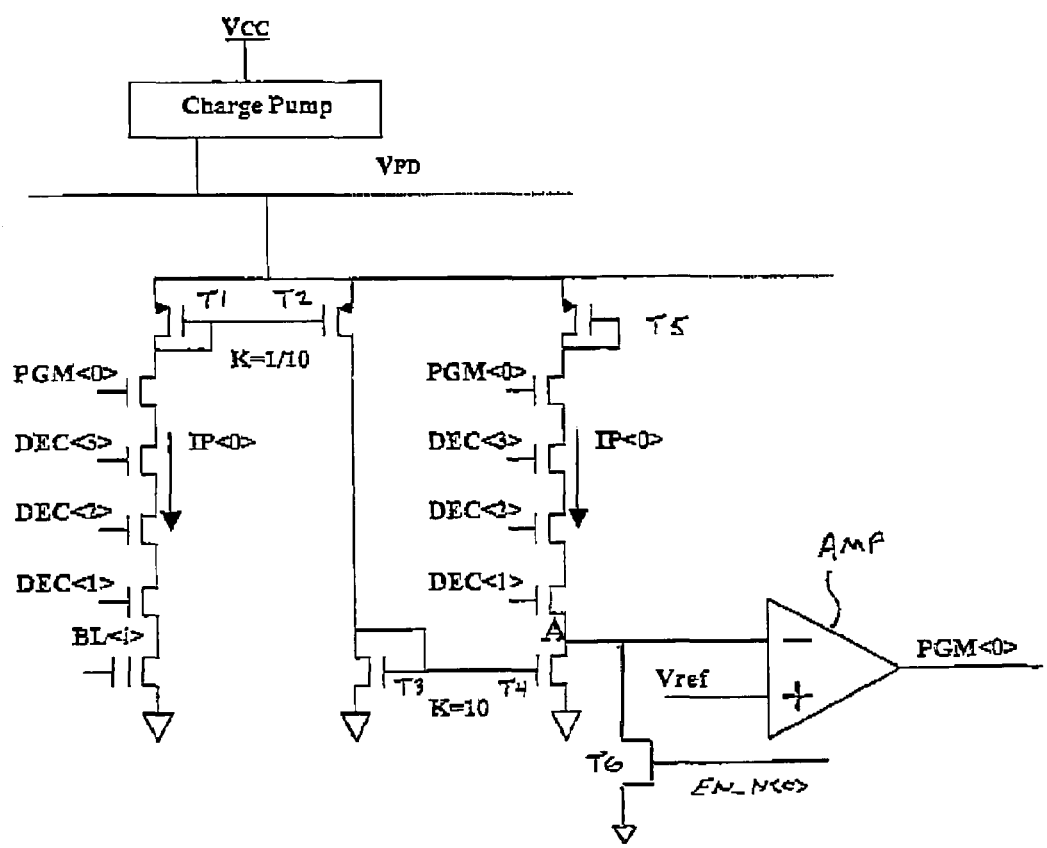
FIG. 3 is a schematic diagram of the selection/deselection circuit according to the present invention.

An embodiment of the selection/deselection circuit in accordance with the invention is depicted in FIG. 3. Differently from known selection/deselection circuits, the illustrated circuit comprises a dummy line, the transistors of which are identical to those of the decoding line and are controlled by the same signals.

The current flowing in the decoding line is replicated in the dummy line by two current mirrors, the mirror ratios of which are a reciprocal of one another. The first current mirror is defined by transistors T1 and T2, and the second current mirror is defined by transistors T3 and T4. To ensure that the dummy line will be biased with the same voltage that biases the decoding line, a diode-connected load transistor T5 couples the dummy line with the line at a regulated voltage $V_{PD}$. This load transistor is identical to the diode-connected input transistor of the current mirror in series with the decoding line, thus the voltage drops are the same.

The current mirrors ensure that the current flowing through the dummy line is equal to the current flowing in the decoding line. Moreover, the dummy line is identical to the decoding line, thus the voltage on node A is a replica of the voltage $BL_{<i>}$.

As shown in FIG. 3, an error amplifier AMP generates the enable/disable signal PGM<0>. A start-up line comprising an enable transistor T6 is connected to the negative input of the error amplifier AMP. The start-up line operates in response to an external command EN, and starts up the circuit even when the generated signal PGM<0> is null. The generated signal PGM<0> controls in a continuous mode of the relative selection/deselection transistors. If the voltage BL<i> decreases because the voltage drop V(Ip) increases, the voltage on node A decreases. The operational amplifier AMP will then increase the amplitude of the output of the selection/deselection signal PGM<0>. The voltage applied to the series of decoding transistors and also to node A (drain of the cell) will increase. This compensates the sensed decrease in voltage.

A closed loop circuit for generating a regulated signal PGM, as illustrated in FIG. 3 for example, is required for each bit-line. For the memory device of FIG. 1, 16 such circuits including 16 dummy lines connected as in FIG. 3 are needed for keeping at a desired reference voltage VREF all the bit line voltage $BL_{<i>}$ for the 16*N*M*L memory cells.

Figure 1:
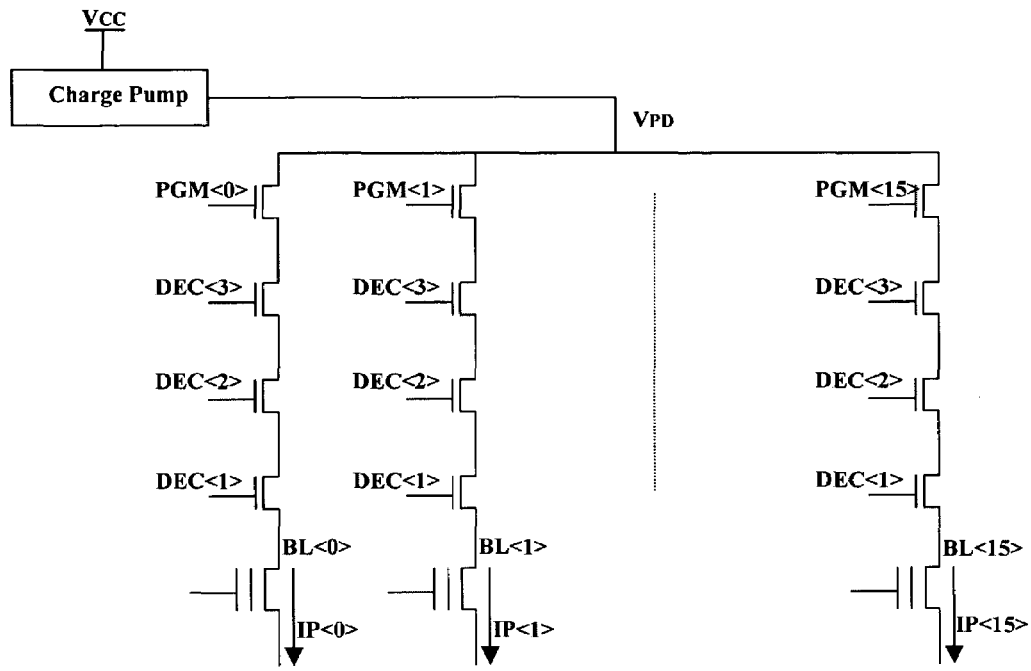
FIG. 1 is a schematic diagram of a bit-line selection/deselection circuit for a non-volatile memory according to the prior art.

The total current $I_{TOT/BIT}$ delivered by the charge pump circuit is $$I_{TOT/BIT} = 2I_{P0} + \frac{1}{K}I_{P0}$$

where $I_{P0}$ is the total current delivered by the charge pump circuit for the device of FIG. 1, and 1/K is the mirror ratio of the current mirror in series with the decoding path in the device of FIG. 3.

To reduce the total current $I_{TOT/BIT}$ requirement, current mirrors having a relatively small mirror ratio 1/K are formed. This also results in a savings of the occupied silicon area. For instance, by choosing K=10, the total current $I_{TOT/BIT}$ requirement is practically twice the current delivered by the charge pump circuit as in the prior art architecture of FIG. 1.

Thus, the invention may imply doubling the programming current absorption for each bit $I_{P<i>}$, but in most cases this is tolerated even by the same charge pump circuits being used. The increase of power consumption is a fair price to pay to significantly enhance the precision with which the voltage $BL_{<i>}$ acting on each addressed cell is determined with the circuit of the present invention.

That which is claimed is:

1. A bit-line selection circuit for a memory device comprising:
    a decoding line including a regulated voltage node receiving a regulated voltage and a programming voltage node providing a programming voltage for a cell in the memory device, said decoding line comprising at least one input transistor connected to the regulated voltage node and being controlled by an enable/disable signal;
    a dummy line identical to said decoding line and being controlled by the enable/disable signal;
    an equalization circuit connected between said decoding and dummy lines for setting a current in said dummy line equal to a current in said decoding line; and
    a regulating circuit for regulating the programming voltage generated at the programming voltage node of said decoding line by compensating for differences between the programming voltage and a reference voltage, said regulating circuit having a first input for receiving the reference voltage, a second input for receiving a sensed voltage on the programming voltage node in said dummy line, and an output for providing the enable/disable signal.

2. A bit-line selection circuit according to claim 1, wherein said regulation circuit comprises an operational amplifier having a non-inverting input corresponding to the first input, and an inverting input corresponding to the second input.

3. A bit-line selection circuit according to claim 1, wherein said equalization circuit comprises:
    a first current mirror connecting said decoding line to the regulated voltage node, and comprising an input transistor in series with said decoding line;
    a diode-connected load transistor identical with the input transistor of said first current mirror for connecting said dummy line to the regulated voltage node; and
    a second current mirror connecting said dummy line to a voltage reference node, and comprising an input transistor in series with said dummy line, said second current mirror having a mirror ratio that is a reciprocal of the mirror ratio of said first current mirror.

4. A bit-line selection circuit according to claim 3, wherein the mirror ratio of said first current mirror is less than 0.1.

5. A memory comprising:
    an array of non-volatile memory cells; and
    a plurality of bit-line selection circuits connected to said array of non-volatile memory cells, each bit line selection circuit comprising a decoding line including a regulated voltage node and a programming voltage node generating a programming voltage for a corresponding non-volatile memory cell, said decoding line comprising at least one input transistor connected to the regulated voltage node and being controlled by an enable/disable signal, a dummy line identical to said decoding line and being controlled by the enable/disable signal, an equalization circuit connected between said decoding and dummy lines for setting a current in said dummy line equal to a current in said decoding line, and a regulating circuit for regulating the programming voltage generated at the programming voltage node of said decoding line by compensating for differences between a programming voltage and the reference voltage, said regulating circuit having a first input for receiving the reference voltage, a second input for receiving a sensed voltage on the programming voltage node in said dummy line, and an output for providing the enable/disable signal.

6. A memory according to claim 5, wherein said regulation circuit comprises an operational amplifier having a non-inverting input corresponding to the first input, and an inverting input corresponding to the second input.

7. A memory according to claim 5, wherein said equalization circuit comprises:

a first current mirror connecting said decoding line to the regulated voltage node, and comprising an input transistor in series with said decoding line;

a diode-connected load transistor identical with the input transistor of said first current mirror for connecting said dummy line to the regulated voltage node; and a second current mirror connecting said dummy line to a voltage reference node, and comprising an input transistor in series with said dummy line, said second current mirror having a mirror ratio that is a reciprocal of the mirror ratio of said first current mirror.

8. A memory according to claim 7, wherein the mirror ratio of said first current mirror is less than 0.1.

9. A memory comprising:

a charge pump providing a regulated voltage to a regulated voltage node;

an array of memory cells arranged in rows and columns; and a plurality of bit-line selection circuits connected to the columns of said array of memory cells, each bit line selection circuit comprising a decoding line including the regulated voltage node and a programming voltage node and generating a programming voltage for a memory cell in a corresponding bit line, said decoding line comprising at least one input transistor connected to the regulated voltage node and being controlled by an enable/disable signal, a dummy line identical to said decoding line and being controlled by the enable/disable signal, at least one current mirror connected between said decoding and dummy lines for setting a current in said dummy line equal to a current in said decoding line, and an error amplifier having a first input for receiving a reference voltage, a second input for receiving a sensed voltage on the programming voltage node in said dummy line, and an output for providing the enable/disable signal which compensates for differences between the programming voltage and the reference voltage.

10. A memory according to claim 9, wherein said error amplifier regulates the programming voltage generated at the programming voltage node in said decoding line, and has a non-inverting input corresponding to the first input and an inverting input corresponding to the second input.

11. A memory according to claim 9, wherein said at least one current mirror comprises:

a first current mirror connecting said decoding line to the regulated voltage node, and comprising an input transistor in series with said decoding line; and a second current mirror connecting said dummy line to a voltage reference node, and comprising an input transistor in series with said dummy line, said second current mirror having a mirror ratio that is a reciprocal of the mirror ratio of said first current mirror.

12. A memory according to claim 11, further comprising a diode-connected load transistor identical with the input transistor of said first current mirror for connecting said dummy line to the regulated voltage node.

13. A memory according to claim 11, wherein the mirror ratio of said first current mirror is less than 0.1.

14. A method for selecting a memory cell within an array of memory cells using at least one bit-line selection circuit comprising a decoding line including a regulated voltage node and a programming voltage node, the decoding line comprising at least one input transistor connected to the regulated voltage node and being controlled by an enable/disable signal, and a dummy line identical to the decoding line and being controlled by the enable/disable signal, the method comprising:

setting a current in the dummy line equal to a current in the decoding line; and regulating a programming voltage generated at the programming voltage node of the decoding line using a regulating circuit to compensate for differences between the programming voltage and the reference voltage.

15. A method according to claim 14, wherein the regulating circuit comprises an operational amplifier having a non-inverting input corresponding to the first input, and an inverting input corresponding to the second input.

16. A method according to claim 14, wherein setting the current is based upon:

a first current mirror connecting the decoding line to the regulated voltage node, and comprising an input transistor in series with the decoding line;

a diode-connected load transistor identical with the input transistor of the first current mirror for connecting the dummy line to the regulated voltage node; and a second current mirror connecting the dummy line to a voltage reference node, and comprising an input transistor in series with the dummy line, the second current mirror having a mirror ratio that is a reciprocal of the mirror ratio of the first current mirror.

17. A method according to claim 16, wherein the mirror ratio of the first current mirror is less than 0.1.

* * * * *

UNITED STATES PATENT AND TRADEMARK OFFICE
CERTIFICATE OF CORRECTION

PATENT NO.         : 7,254,062 B2                                           Page 1 of 3
APPLICATION NO.    : 11/120766
DATED              : August 7, 2007
INVENTOR(S)        : Martines et al.

It is certified that error appears in the above-identified patent and that said Letters Patent is hereby corrected as shown below:

Drawings                Delete: "FIG. 1"

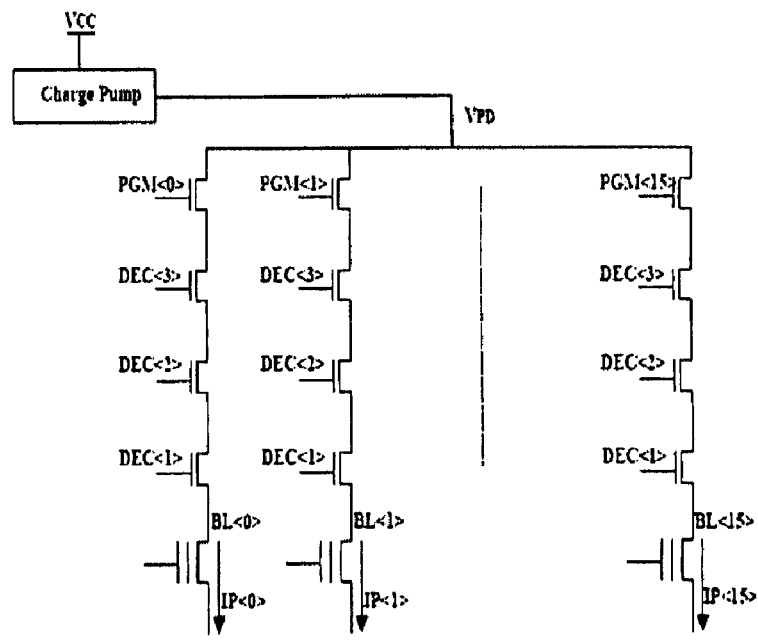

FIG. 1

Insert -- FIG. 1 --

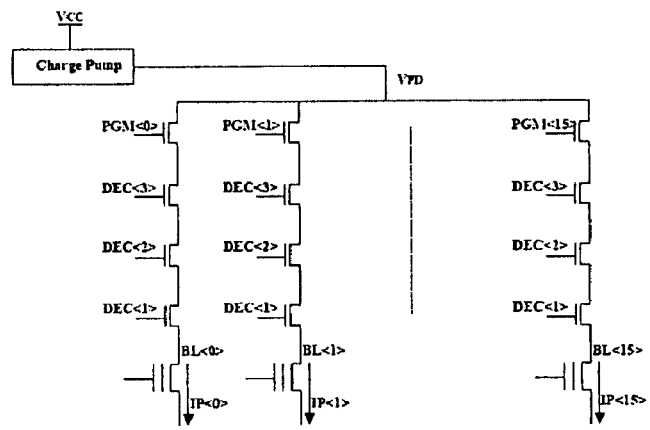

FIG. 1
(PRIOR ART)

UNITED STATES PATENT AND TRADEMARK OFFICE
CERTIFICATE OF CORRECTION

PATENT NO.         : 7,254,062 B2
APPLICATION NO. : 11/120766
DATED               : August 7, 2007
INVENTOR(S)       : Martines et al.

It is certified that error appears in the above-identified patent and that said Letters Patent is hereby corrected as shown below:

Drawings            Delete: "FIG. 2"

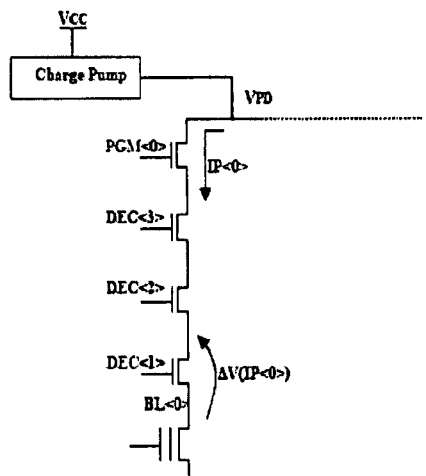

FIG. 2

Figure 2:
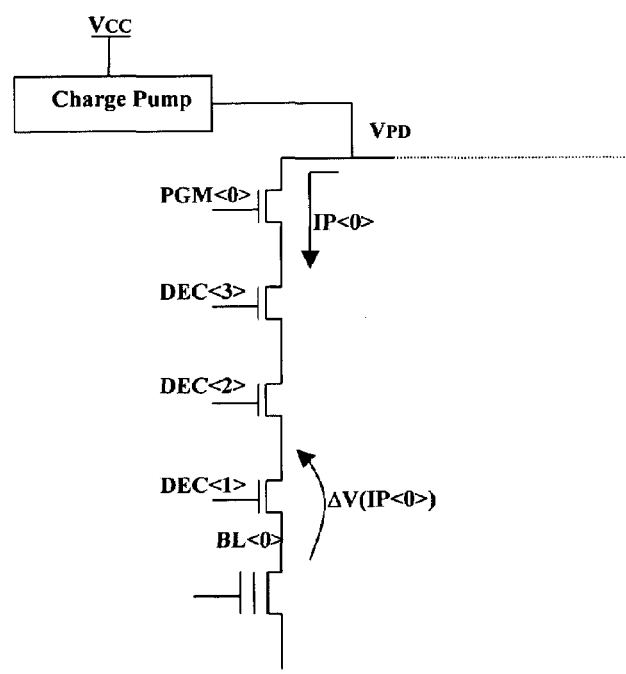
FIG. 2 is a schematic diagram illustrating the voltage drop taking place on a low level decoding transistor according to the prior art.

Insert -- FIG. 2 --

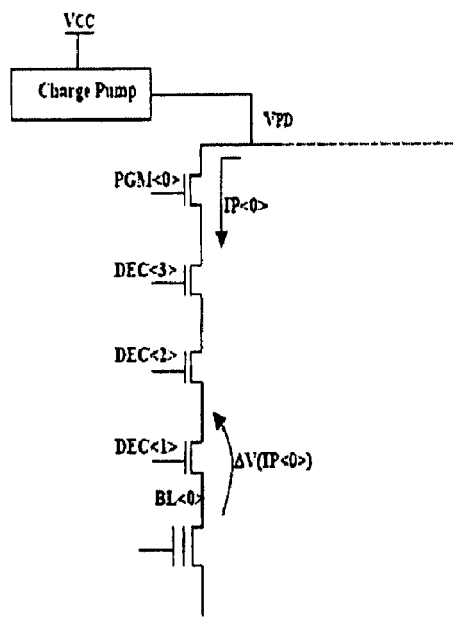

FIG. 2
(PRIOR ART)

UNITED STATES PATENT AND TRADEMARK OFFICE
CERTIFICATE OF CORRECTION

PATENT NO. : 7,254,062 B2
APPLICATION NO. : 11/120766
DATED : August 7, 2007
INVENTOR(S) : Martines et al.

It is certified that error appears in the above-identified patent and that said Letters Patent is hereby corrected as shown below:

Column 1, Line 13    Delete: "A"
                     Insert -- An --

Column 3, Line 3     Delete: "V(Ip)"
                     Insert -- $\Delta V(I_P)$ --

Signed and Sealed this

Twenty-fifth Day of March, 2008

JON W. DUDAS
*Director of the United States Patent and Trademark Office*